US012733384B2

(12) United States Patent
Hou et al.

(10) Patent No.: US 12,733,384 B2

(45) Date of Patent: Sep. 8, 2026

(54) DISPLAY SUBSTRATE AND METHOD FOR MANUFACTURING THE SAME, DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Peng Hou, Beijing (CN); Yuan He, Beijing (CN); Huaisen Ren, Beijing (CN); Zhiliang Shao, Beijing (CN); Pei Liu, Beijing (CN); Xiaoyi Wang, Beijing (CN); Chao Ye, Beijing (CN); Yi Peng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 508 days.

(21) Appl. No.: 18/274,784

(22) PCT Filed: Jul. 1, 2022

(86) PCT No.: PCT/CN2022/103253

§ 371 (c)(1),
(2) Date: Jul. 28, 2023

(87) PCT Pub. No.: WO2023/005595

PCT Pub. Date: Feb. 2, 2023

(65) Prior Publication Data

US 2024/0099111 A1 Mar. 21, 2024

(30) Foreign Application Priority Data

Jul. 30, 2021 (CN) ......................... 202110875635.6

(51) Int. Cl.
*H10K 59/80* (2023.01)
*H10K 59/12* (2023.01)

(52) U.S. Cl.
CPC ..... *H10K 59/8792* (2023.02); *H10K 59/1201* (2023.02)

(58) Field of Classification Search
CPC ....................... H10K 59/8792; H10K 59/1201
See application file for complete search history.

(56) References Cited

U.S. PATENT DOCUMENTS

2021/0226175 A1* 7/2021 Cao ....................... H10K 59/40

FOREIGN PATENT DOCUMENTS

CN 106486521 A 3/2017
CN 112670431 A 4/2021

(Continued)

*Primary Examiner* — Anne M Hines

(74) *Attorney, Agent, or Firm* — Nath, Goldberg & Meyer; Joshua B. Goldberg

(57) ABSTRACT

There is provided a display substrate, including: a base; light-emitting units on a side of the base; a flat light-shielding functional layer, including a black matrix and a first planarization layer, on a side of the light-emitting units away from the base, light outgoing openings being provided in the black matrix and being in one-to-one correspondence with the light-emitting units, and the first planarization layer at least filling the light outgoing openings; and a color filter layer, including color filter patterns in one-to-one correspondence with the light outgoing openings, on a side of the flat light-shielding functional layer away from the base, an orthographic projection of each color filter pattern on the base covering an orthographic projection of the light outgoing opening corresponding to the color filter pattern on the base. A method for manufacturing a display substrate, a display panel and a display apparatus are further provided.

19 Claims, 8 Drawing Sheets

(56) References Cited

FOREIGN PATENT DOCUMENTS

| | | | |
|---|---|---|---|
| CN | 112750962 | A | 5/2021 |
| CN | 113054136 | A | 6/2021 |
| CN | 215933642 | U | 3/2022 |

* cited by examiner

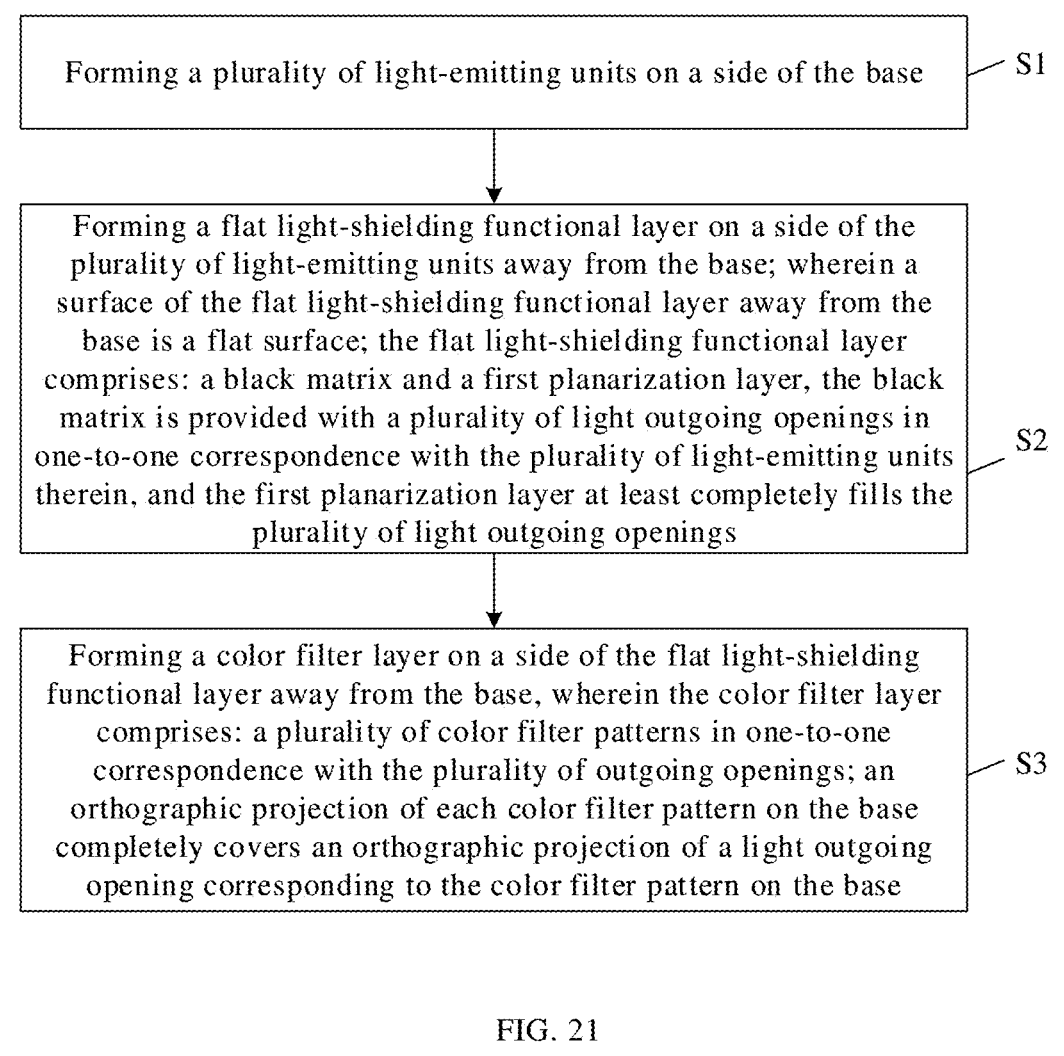

Forming a plurality of light-emitting units on a side of the base — S1

Forming a flat light-shielding functional layer on a side of the plurality of light-emitting units away from the base; wherein a surface of the flat light-shielding functional layer away from the base is a flat surface; the flat light-shielding functional layer comprises: a black matrix and a first planarization layer, the black matrix is provided with a plurality of light outgoing openings in one-to-one correspondence with the plurality of light-emitting units therein, and the first planarization layer at least completely fills the plurality of light outgoing openings — S2

Forming a color filter layer on a side of the flat light-shielding functional layer away from the base, wherein the color filter layer comprises: a plurality of color filter patterns in one-to-one correspondence with the plurality of outgoing openings; an orthographic projection of each color filter pattern on the base completely covers an orthographic projection of a light outgoing opening corresponding to the color filter pattern on the base — S3

FIG. 21

DISPLAY SUBSTRATE AND METHOD FOR MANUFACTURING THE SAME, DISPLAY PANEL AND DISPLAY APPARATUS

This is a National Phase Application filed under 35 U.S.C. 371 as a national stage of PCT/CN2022/103253, filed Jul. 1, 2022 an application claiming the benefit of Chinese Application No. 202110875635.6, filed Jul. 30, 2021, the content of each of which is hereby incorporated by reference in its entirety.

TECHNICAL FIELD

The present disclosure relates to the field of display technology, and in particular to a display substrate, a method for manufacturing a display substrate, a display panel and a display apparatus.

BACKGROUND

An organic light-emitting diode (OLED) display panel has advantages of self-luminescence, ultra-thinness, fast reaction speed, high contrast, wide viewing angle, and the like, and thus, attracts much attention. In order to effectively reduce the reflectivity of the OLED display panel under relatively strong ambient light, a polarizer (POL) is generally disposed on a light outgoing side of the OLED display panel to achieve the effect of reducing the reflectivity of the OLED display panel under the ambient light. However, with the polarizer, the light outgoing loss of the OLED display panel can be caused. Moreover, the polarizer generally has a relatively great thickness (of about 100 μm) and is made of a fragile material, resulting in that the whole thickness of the display panel is relatively large, which is detrimental to the development of a bendable product.

A color filter on encapsulation (COE) technology is further provided in the related art, to replace the polarizer with a color filter (including a black matrix and a color filter pattern), which belongs to the POL-less technology. The COE technology can improve the light outgoing rate of the OLED display panel (the light outgoing rate of the OLED display panel is increased from 42% to 60%) and effectively reduce the thickness of the display panel, and the COE technology is further one of key technologies for realizing the development of a dynamic bendable product.

SUMMARY

In a first aspect, an embodiment of the present disclosure provides a display substrate, including: a base; a plurality of light-emitting units on a side of the base; a flat light-shielding functional layer, including a black matrix and a first planarization layer, on a side of the plurality of light-emitting units away from the base, a plurality of light outgoing openings being provided in the black matrix and being in one-to-one correspondence with the plurality of light-emitting units, and the first planarization layer at least filling the plurality of light outgoing openings; and a color filter layer, including a plurality of color filter patterns in one-to-one correspondence with the plurality of light outgoing openings, on a side of the flat light-shielding functional layer away from the base, an orthographic projection of each of the plurality of color filter patterns on the base completely covering an orthographic projection of the light outgoing opening corresponding to the color filter pattern on the base, a surface of each of the plurality of color filter patterns away from the base being a flat surface.

In some implementations, a minimum thickness of the flat light-shielding functional layer in a direction perpendicular to the base is H_min, a maximum thickness of the flat light-shielding functional layer in the direction perpendicular to the base is H_max, and $H\_min/H\_max \geq 0.95$.

In some implementations, a surface of the flat light-shielding functional layer away from the base is substantially flat.

In some implementations, the first planarization layer is in the plurality of light outgoing openings, and a surface of the first planarization layer away from the base is substantially flush with a surface of the black matrix away from the base.

In some implementations, the first planarization layer includes first portions in the plurality of light outgoing openings and a second portion on a side of the black matrix away from the base, the second portion completely covers the first portions and the black matrix, and a surface of the second portion away from the base is substantially flat.

In some implementations, for any one color filter pattern, a width b of the color filter pattern in a preset direction parallel to the base satisfies: $b \geq [(h1+h2)/(h2+h3)]*a+[(h1+2*h2+h3)/(h2+h3)]*c$; c is a width of the light outgoing opening corresponding to the color filter pattern in the preset direction; a is a width of the light-emitting unit corresponding to the color filter pattern in the preset direction, h1 is a distance between a plane where a surface of the color filter pattern close to the base is located and a plane where a surface of the black matrix close to the base is located, h2 is a distance between a plane where a surface of the light-emitting unit corresponding to the color filter pattern away from the base is located and a plane where the surface of the black matrix close to the base is located, and h3 is a thickness of the black matrix in a direction perpendicular to the base.

In some implementations, the flat light-shielding functional layer further includes: at least one inorganic functional layer made of an inorganic material; and for any one inorganic functional layer, the inorganic functional layer is on a side of the first planarization layer away from the black matrix or on a side of the first planarization layer close to the black matrix.

In some implementations, the at least one inorganic functional layer includes: a quarter-wave plate.

In some implementations, the first planarization layer is made of an organic insulating material.

In some implementations, a transmittance p of the first planarization layer for visible light satisfies: $p \geq 50\%$.

In some implementations, the plurality of color filter patterns includes: a first color filter pattern, a second color filter pattern, and a third color filter pattern; and a surface of the first color filter pattern close to the base, a surface of the second color filter pattern close to the base and a surface of the third color filter pattern close to the base are substantially on a same plane; or, the surface of the first color filter pattern close to the base and the surface of the second color filter pattern close to the base are on the same plane; the surface of the third color filter pattern close to the base and the surface of the first color filter pattern close to the base are on different planes, and the display substrate further includes a second planarization layer between a plane where the surface of the first color filter pattern close to the base is located and a plane where the surface of the third color filter pattern close to the base is located; or, any two of the surface of the first color filter pattern close to the base, the surface of the second color filter pattern close to the base, and the surface of the third color filter pattern close to the base are on different planes, and the display substrate further includes a second planarization layer between every two of the surface of the first color filter pattern close to the base, the surface of the second color filter pattern close to the base, and the surface of the third color filter pattern close to the base.

In some implementations, for the first color filter pattern, the second color filter pattern, and the third color filter pattern, a first one is a red filter pattern, a second one is a green filter pattern, and a third one is a blue filter pattern.

In some implementations, the plurality of color filter patterns are made of amorphous silicon.

In some implementations, the display substrate further includes an encapsulation layer between the plurality of light-emitting units and the flat light-shielding functional layer.

In some implementations, the display substrate further includes a touch functional layer between the encapsulation layer and the flat light-shielding functional layer.

In a second aspect, an embodiment of the present disclosure further provides a display panel, including: the display substrate in the above first aspect.

In a third aspect, an embodiment of the present disclosure further provides a display apparatus, including: the display panel in the above second aspect.

In a fourth aspect, an embodiment of the present disclosure further provides a method for manufacturing a display substrate, applied to manufacture the display substrate in the first aspect, the method includes: forming a plurality of light-emitting units on a side of a base; forming a flat light-shielding functional layer on a side of the plurality of light-emitting units away from the base, the flat light-shielding functional layer including a black matrix and a first planarization layer, the black matrix being provided therein with a plurality of light outgoing openings in one-to-one correspondence with the plurality of light-emitting units, and the first planarization layer at least completely filling the plurality of light outgoing openings; and forming a color filter layer on a side of the flat light-shielding functional layer away from the base, the color filter layer including a plurality of color filter patterns in one-to-one correspondence with the plurality of light outgoing openings, an orthographic projection of each color filter pattern on the base completely covering an orthographic projection of the light outgoing opening corresponding to the color filter pattern on the base.

BRIEF DESCRIPTION OF DRAWINGS

FIG. 21 is a flowchart of a method for manufacturing a display substrate according to an embodiment of the present disclosure.

DETAIL DESCRIPTION OF EMBODIMENTS

In order to enable the objects, technical solutions and advantages of the embodiments of the present disclosure to be more apparent, the technical solutions of the embodiments of the present disclosure will be clearly and completely described below with reference to the drawings of the embodiments of the present disclosure. It is to be understood that the described embodiments are only a part, not all, of embodiments of the present disclosure. The embodiments and features of the embodiments in the present disclosure may be combined with each other without conflict. All other embodiments, which can be derived by one of ordinary skill in the art from the described embodiments of the present disclosure without inventive step, are within the scope of protection of the present disclosure.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections.

Figure 1:
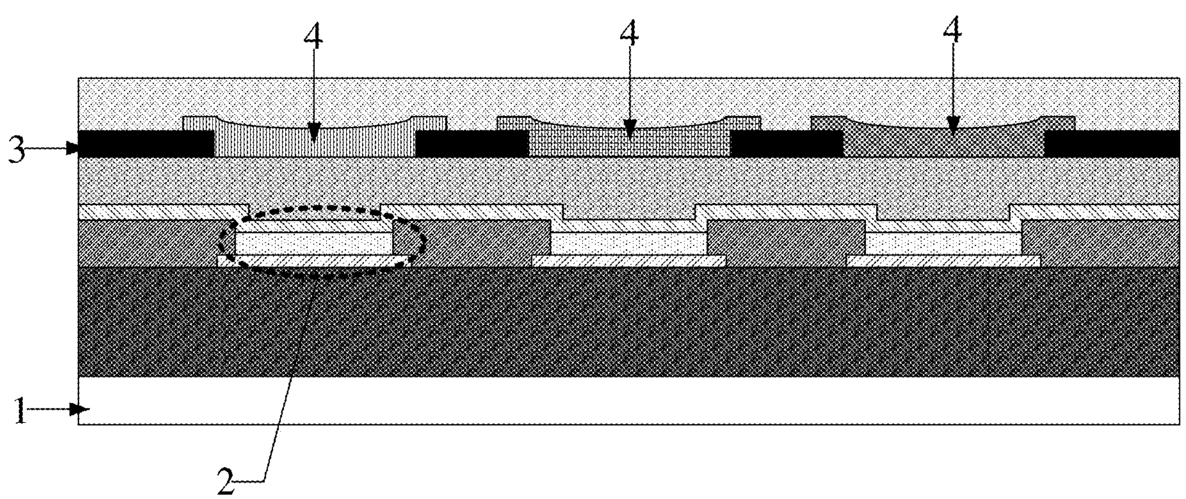
FIG. 1 is a schematic cross-sectional view of a display substrate in the related art.

FIG. 1 is a schematic cross-sectional view of a display substrate in the related art. As shown in FIG. 1, a black matrix 3 and a color filter layer are disposed on a light outgoing side of light-emitting units 2, and form a filter structure, which has a function of a conventional polarizer and can reduce a reflectivity of the ambient light.

A plurality of light outgoing openings are provided in the black matrix 3 and are in one-to-one correspondence with the light-emitting units 2, and the color filter layer includes a plurality of color filter patterns 4 in one-to-one correspondence with the light outgoing openings. A process for forming the black matrix 3 and the color filter patterns 4 includes: firstly, forming the black matrix 3, and then forming the color filter patterns 4 in the light outgoing openings. The greater a thickness of each color filter pattern 4 is, the better the effect of the color filter pattern 4 filtering the external ambient light is, but the smaller the transmittance of the light emitted from the corresponding light-emitting unit 2 is. In order to balance the effect of the color filter pattern 4 filtering the external ambient light and the transmittance of the light emitted from the corresponding light-emitting unit 2, the thickness of the color filter pattern 4 at the light outgoing opening is actually set to be slightly larger than that of the black matrix 3. Generally, the thickness of the color filter pattern 4 at the light outgoing opening is about 5 μm, and the thickness of the black matrix 3 is about 2.5 μm. In the process for forming the color filter patterns 4, a color film used for forming the color filter patterns 4 is made of an organic material, not only fills the light outgoing openings but also partially covers the black matrix 3. Each color filter pattern 4 formed after the color film made of the organic material is dried is generally uneven at the light outlet opening; specifically, a surface of the color filter pattern 4 away from a base 1 is generally concave at the corresponding light outgoing opening.

Figure 2:
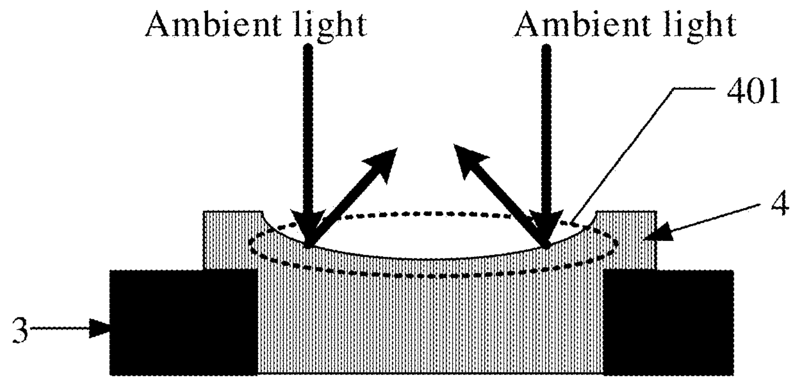
FIG. 2 is a schematic diagram of external ambient light reflected from a concave surface of a color filter pattern.
Figure 3:
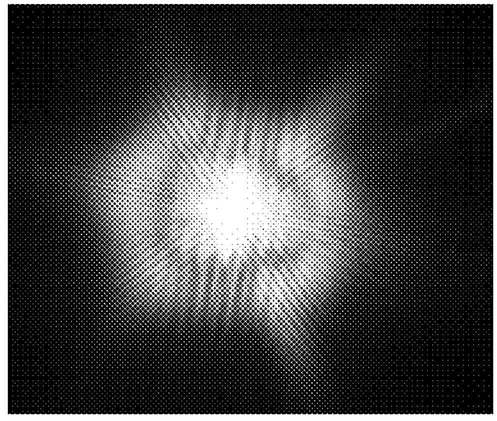
FIG. 3 is a schematic diagram of a reflected light spot formed by a color filter pattern in the related art.

FIG. 2 is a schematic diagram of external ambient light reflected from a concave surface of a color filter pattern; FIG. 3 is a schematic diagram of a reflected light spot formed by a color filter pattern in the related art. As shown in FIG. 2 and FIG. 3, the external ambient light is irregularly reflected (for example, the reflected light of the vertical incident light may be laterally emitted) at a concave surface 401 of the color filter pattern 4, and a reflected light spot formed by the color filter pattern 4 is relatively dispersed as a whole. Meanwhile, the laterally reflected light formed after the ambient light is reflected at the concave surface 401 is to be dispersed during subsequently passing through other layers, that is, the white ambient light is to be dispersed into a plurality of colored light beams, to form a color halo, which affects the user's experiences.

Figure 4:
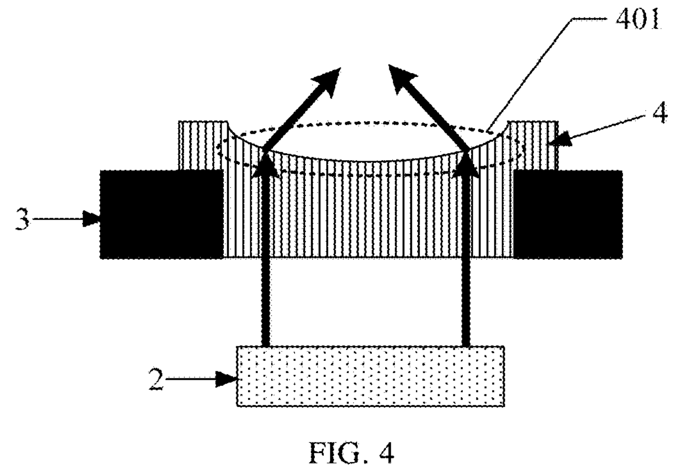
FIG. 4 is a schematic diagram of light emitted by a light-emitting unit and refracted at a concave surface of a color filter pattern.

FIG. 4 is a schematic diagram of light emitted by a light-emitting unit and refracted at a concave surface of a color filter pattern. As shown in FIG. 4, the light emitted by the light-emitting unit 2 is refracted at the concave surface 401 of the color filter pattern 4, and the refracted light is converged toward the middle, that is, the concave surface 401 of the color filter pattern 4 has a light-condensing effect. In this case, a brightness of the light emitted from the middle of the color filter pattern 4 is much greater than that of the light laterally emitted, which results in a significant color shift depending on a viewing angle.

To solve at least one technical problem in the related art, the present disclosure provides a corresponding solution, which will be described in detail with reference to specific embodiments. The technical solution of the present disclosure can effectively improve the problem of dispersion of reflected light spots formed by the color filter patterns and improve the color shift depending on the viewing angle.

Figure 5:
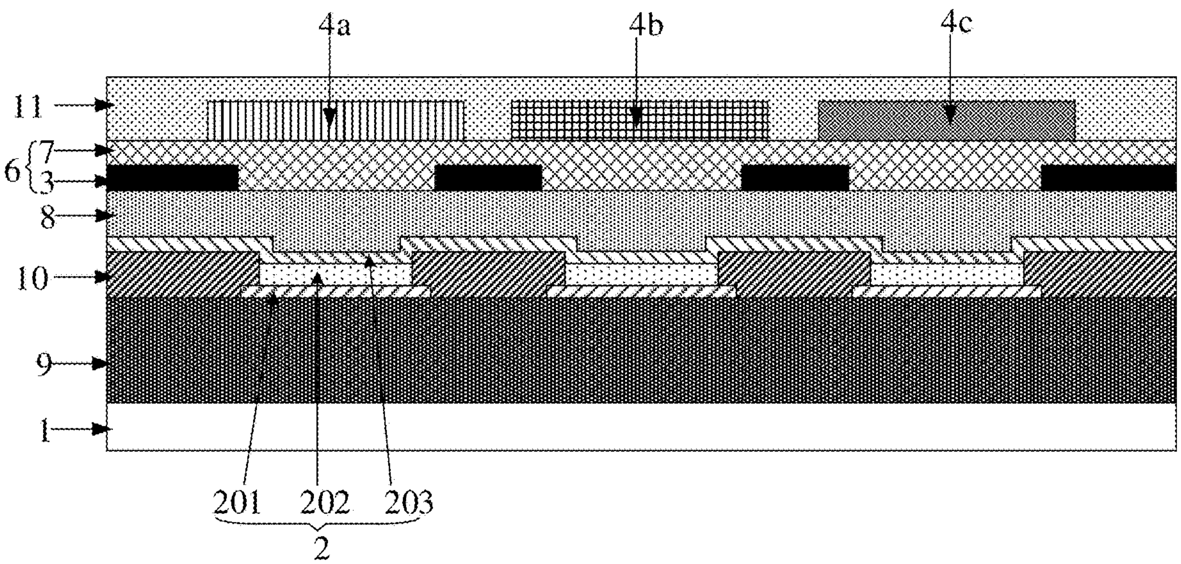
FIG. 5 is a schematic cross-sectional view of a display substrate according to an embodiment of the present disclosure.

FIG. 5 is a schematic cross-sectional view of a display substrate according to an embodiment of the present disclosure. As shown in FIG. 5, the display substrate includes: a base 1, a plurality of light-emitting units 2, a flat light-shielding functional layer 6 and a color filter layer.

The base 1 may be a rigid base (e.g., a glass substrate) or a flexible base (e.g., a polyimide base).

The light-emitting units 2 are positioned on a side of the base 1, to generate and emit light for display. In some implementations, each light-emitting unit 2 includes an organic light-emitting diode; the organic light-emitting diode includes: a cathode 203 and an anode 201 opposite to each other and an organic functional layer 202 located between the cathode 203 and the anode 201, the organic functional layer 202 at least includes an organic light-emitting layer. Alternatively, functional layers such as a hole transport layer, a hole blocking layer, an electron transport layer, and an electron blocking layer and the like may be further provided as desired. In general, each light-emitting unit 2 is configured with a corresponding driving circuit (located in a driving functional layer), the driving circuit includes a driving transistor, and the driving circuit is electrically connected to the corresponding light-emitting unit 2 to drive the light-emitting unit 2 to emit light. In some implementations, the light generated by the light-emitting unit 2 is white light. Alternatively, the color of the light generated by each light-emitting unit 2 may also be designed individually as desired, for example, a part of the light-emitting units 2 emit red light, another part of the light-emitting units 2 emit green light, and the rest of the light-emitting units 2 emit blue light.

The flat light-shielding functional layer 6 is located on a side of the light-emitting units 2 away from the base 1, and includes: a black matrix 3 and a first planarization layer 7, a plurality of light outgoing openings are arranged in the black matrix 3 and are in one-to-one correspondence with the light-emitting units 2, and the first planarization layer 7 at least fills the light outgoing openings. In the embodiment of the present disclosure, by providing the first planarization layer, it is advantageous that a surface of the flat light-shielding functional layer 6 finally formed away from the base 1 is substantially flat.

The color filter layer is located on a side of the flat light-shielding functional layer 6 away from the base 1, and includes: a plurality of color filter patterns 4*a*, 4*b*, 4*c* (only three color filter patterns are exemplarily shown in the drawings) in one-to-one correspondence with the light outgoing openings, and an orthographic projection of each of the color filter patterns 4*a*, 4*b*, 4*c* on the base 1 completely covers an orthographic projection of the light outgoing opening corresponding to the color filter pattern 4 on the base 1.

It should be noted that, in the present disclosure, a surface being "substantially flat", means that the surface is planar or approximately planar, and the surface is parallel or approximately parallel to a plane where the base 1 is located. In the following description, the substantially flat surface is referred to as a planarization surface.

In some implementations, a minimum thickness of the flat light-shielding functional layer 6 in a direction perpendicular to the base 1 is $H\_min$, a maximum thickness of the flat light-shielding functional layer 6 in the direction perpendicular to the base 1 is $H\_max$, and $H\_min/H\_max \geq 0.95$.

In some implementations, a material of the first planarization layer 7 includes an organic insulating material, such as photoresist; the photoresist may be a positive photoresist or a negative photoresist.

In some implementations, a transmittance p of the first planarization layer 7 for the visible light satisfies: p≥50%, to ensure the transmittance of the light emitted by the light-emitting units 2.

In the flat light-shielding functional layer 6, the black matrix 3 is used for defining the light outgoing openings, and the first planarization layer 7 is used for filling the light outgoing openings, so that the surface of the flat light-shielding functional layer 6 away from the base 1 is a planarization surface, for providing a planarization base for the color filter layer to be formed subsequently. By forming the color filter patterns 4*a*, 4*b*, 4*c* in the color filter layer based on the planarization base, the surface of the color filter patterns 4*a*, 4*b*, 4*c* away from the base 1 can be made substantially flat.

Figure 6:
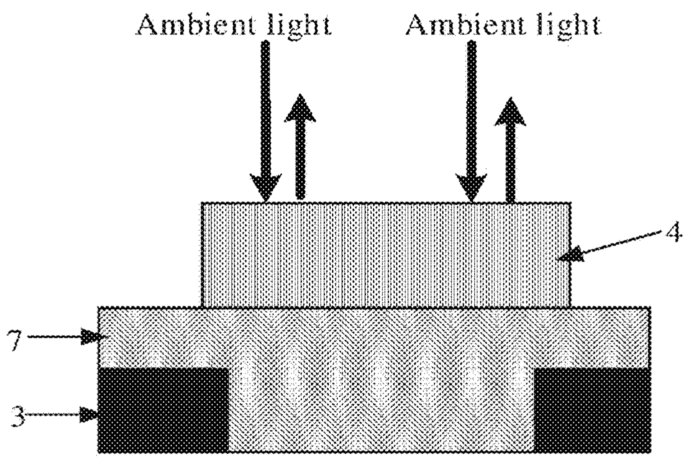
FIG. 6 is a schematic diagram of external ambient light reflected from a planarization surface of a color filter pattern.
Figure 7:
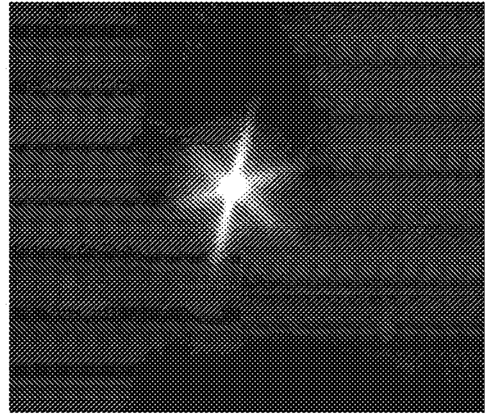
FIG. 7 is a schematic diagram of a reflected light spot formed by a color filter pattern according to an embodiment of the present disclosure.

FIG. 6 is a schematic diagram of external ambient light reflected from a planarization surface of a color filter pattern; FIG. 7 is a schematic diagram of a reflected light spot formed by a color filter pattern according to an embodiment of the present disclosure. As shown in FIG. 6 and FIG. 7, the external ambient light may be specularly reflected (for example, the reflected light of the vertical incident light may be emitted vertically) at the planarization surface of the color filter pattern 4, and the reflected light spot formed by the color filter pattern 4 is relatively concentrated as a whole, and substantially, no color halo is to be generated.

Figure 8:
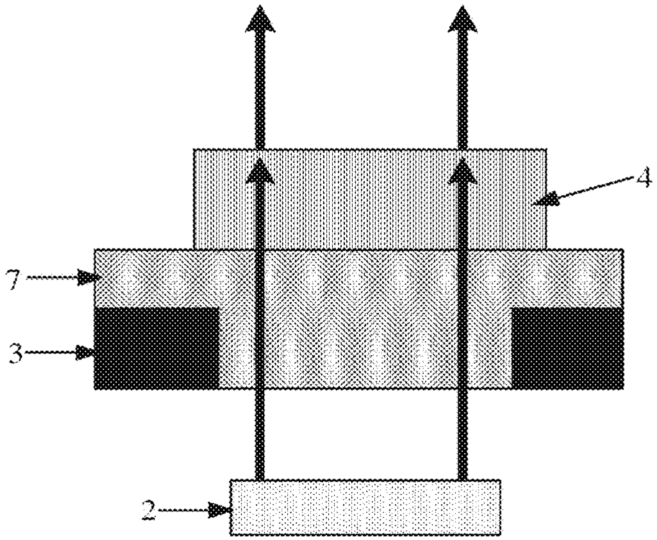
FIG. 8 is a schematic diagram of light, emitted by a light-emitting unit, passing through a color filter pattern.

FIG. 8 is a schematic diagram of light, emitted by a light-emitting unit, passing through a color filter pattern. As shown in FIG. 8, in the process that the light emitted by the light-emitting unit 2 passes through the color filter pattern 4, a propagation direction of the light remains unchanged or is only shifted by a relatively small angle. In this case, the brightness distribution of the outgoing light at the color filter pattern 4 is substantially the same as that at the light-emitting unit 2. Therefore, the technical solution of the present disclosure can improve the problem of color shift, depending on the viewing angle, caused by the concave surface of the color filter pattern 4 in the related art to a certain extent.

Figure 9:
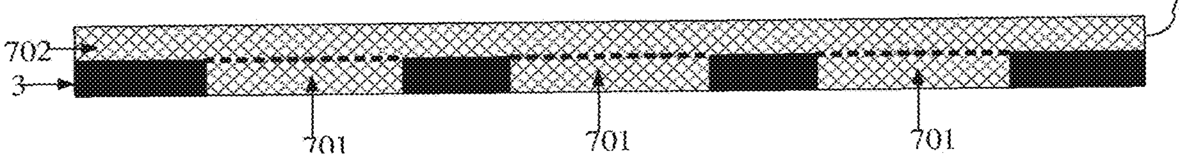
FIG. 9 is a schematic cross-sectional view of a flat light-shielding functional layer shown in FIG. 5.

FIG. 9 is a schematic cross-sectional view of a flat light-shielding functional layer shown in FIG. 5. As shown in FIGS. 5 and 9, in some implementations, the first planarization layer 7 includes first portions 701 located in the light-exiting openings and a second portion 702 located on a side of the black matrix 3 away from the base 1, the second portion 702 completely covers the first portion 701 and the black matrix 3, and a surface of the second portion 702 away from the base 1 is substantially flat. In the embodiment of the present disclosure, the larger a thickness of the second portion 702 is, the less the light outgoing openings have a topographic effect on the surface of the second portion 702 away from the base 1, and the easier the second portion 702 is formed with a planarization surface. In the embodiment shown in FIGS. 5 and 9, a surface of the flat light-shielding functional layer 6 away from the base 1 is specifically the surface of the second portion 702 of the first planarization layer 7 away from the base 1.

It should be noted that the flat light-shielding functional layer 6 shown in FIG. 5 and FIG. 9 includes the black matrix 3 and the first planarization layer 7, the first planarization layer 7 includes the first portions 701 located in the light outgoing openings and the second portion 702 located on the side of the black matrix 3 away from the base 1, and the surface of the second portion 702 away from the base 1 acts as the surface of the flat light-shielding functional layer 6 away from the base 1, which is only exemplary and does not limit the technical solution of the present disclosure.

Figure 10:
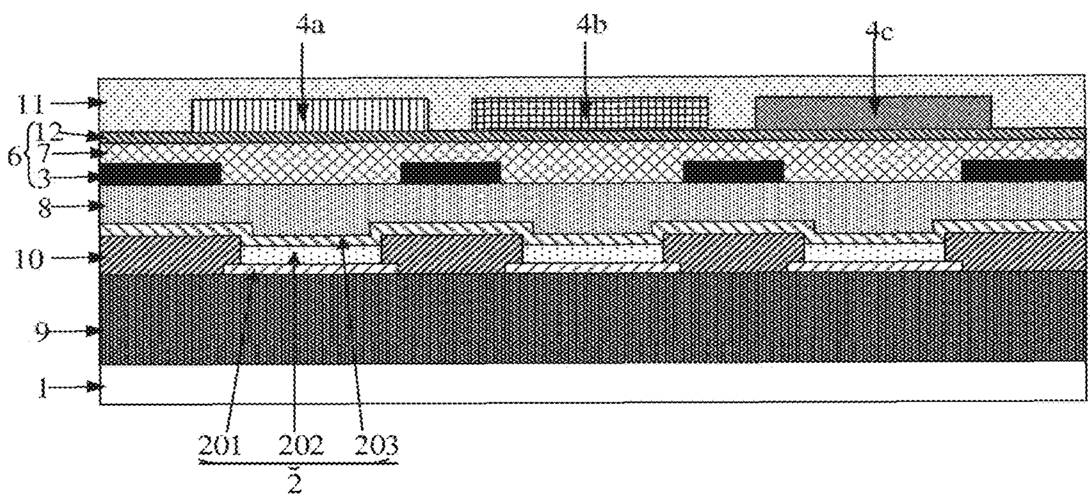
FIG. 10 is a schematic cross-sectional view of a display substrate according to an embodiment of the present disclosure.
Figure 11:
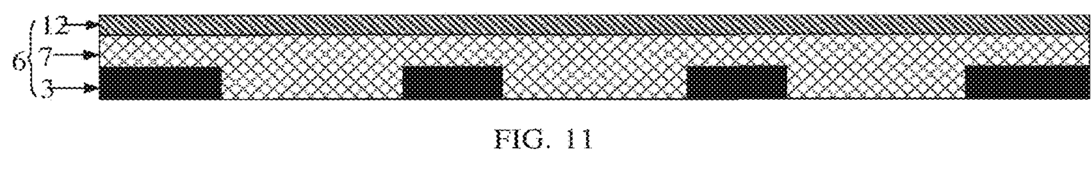
FIG. 11 is a schematic cross-sectional view of a flat light-shielding functional layer shown in FIG. 10.

FIG. 10 is a schematic cross-sectional view of a display substrate according to an embodiment of the present disclosure; FIG. 11 is a schematic cross-sectional view of a flat light-shielding functional layer 6 shown in FIG. 10. As shown in FIG. 10 and FIG. 11, unlike the above embodiments, the flat light-shielding functional layer 6 shown in FIG. 10 and FIG. 11 includes not only the black matrix 3 and the first planarization layer 7, but also at least one inorganic functional layer 12, and a material of the inorganic functional layer 12 includes an inorganic material; for any one inorganic functional layer 12, the inorganic functional layer 12 is located on a side of the first planarization layer 7 away from the black matrix 3 or on a side of the first planarization layer 7 close to the black matrix 3. It should be note that, in the embodiment shown in FIG. 11, only one inorganic functional layer 12 is exemplarily shown on the side of the first planarization layer 7 away from the black matrix 3.

In some implementations, the inorganic functional layer 12 shown in FIG. 11 may be a passivation layer, and the material of the passivation layer may include silicon oxide and/or silicon nitride. The passivation layer can encapsulate the first planarization layer 7 and prevent bubbling of the first planarization layer 7 in subsequent high-temperature processes.

In some implementations, the inorganic functional layer 12 shown in FIG. 11 may be a quarter-wave plate (a specific thickness of the quarter-wave plate may be set as desired), and a material of the quarter-wave plate is an inorganic material with a birefringence property, such as quartz, calcite, or the like. In the embodiment of the present disclosure, the filter structure formed by the black matrix 3 and the color filter layer has the function of a conventional polarizer, and the filter structure is used in combination with the quarter-wave plate, so as to further reduce the reflectivity of the ambient light.

Alternatively, the inorganic functional layer 12 on the side of the first planarization layer 7 away from the black matrix 3 may be a layer having another function, and the function and a material of the inorganic functional layer 12 may be set in advance as desired. It should be noted that, in order to ensure that the surface of the flat light-shielding functional layer 6 away from the base 1 is substantially flat, the inorganic functional layer 12 on the side of the first planarization layer 7 away from the black matrix 3 should have a full-surface laying structure.

Figure 12:
FIG. 12 is a schematic cross-sectional view of a flat light-shielding functional layer according to an embodiment of the present disclosure.

FIG. 12 is a schematic cross-sectional view of a flat light-shielding functional layer according to an embodiment of the present disclosure. As shown in FIG. 12, in the embodiment of FIG. 12, one inorganic functional layer 12 is exemplarily illustrated, and the inorganic functional layer 12 is located on the side of the first planarization layer 7 close to the black matrix 3.

In some implementations, the inorganic functional layer 12 shown in FIG. 12 may specifically be a passivation layer (which can encapsulate the black matrix 3), or a quarter-wave plate (which is used in cooperation with a filter structure formed by the black matrix 3 and the color filter layer to further reduce the reflectivity of the ambient light), and the description for the passivation layer and the quarter-wave plate may refer to the above content, and is not repeated herein.

It should be noted that the inorganic functional layer 12 on the side of the first planarization layer 7 close to the black matrix 3 shown in FIG. 12 also have a full-surface laying structure.

Figure 13:
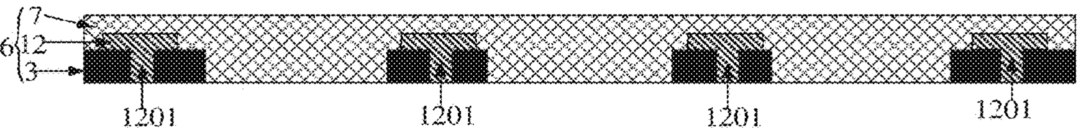
FIG. 13 is a schematic cross-sectional view of a flat light-shielding functional layer according to an embodiment of the present disclosure.

FIG. 13 is a schematic cross-sectional view of a flat light-shielding functional layer according to an embodiment of the present disclosure. As shown in FIG. 13, in some implementations, the inorganic functional layer 12 shown in FIG. 12 may be a conductive functional layer, the conductive functional layer includes at least one conductive structure 1201 (for example, a conductive trace), which may be configured to transmit electrical signals to an electrical structure (not shown) in the display substrate and receive electrical signals from the electrical structure. In some implementations, a material of the at least one conductive structure 1201 includes a transparent conductive material, such as indium tin oxide (having a chemical formula of ITO).

As a specific example, a touch functional layer is further disposed in the display substrate, a plurality of self-capacitance touch electrodes are disposed in the touch functional layer (for example, the self-capacitance touch electrodes are metal mesh electrodes, which are completely covered by the black matrix 3), and the conductive functional layer includes a plurality of conductive traces in one-to-one correspondence with the self-capacitance touch electrodes, and the conductive traces are electrically connected to the corresponding self-capacitance touch electrodes through vias in the black matrix 3.

Alternatively, the inorganic functional layer 12 on the side of the first planarization layer 7 close to the black matrix 3 may be a layer having another function, and the function and material of the inorganic functional layer 12 may be set in advance as desired. It should be noted that, since the first planarization layer 7 is present, the inorganic functional layer 12 on the side of the first planarization layer 7 close to the black matrix 3 may have a full-surface laying structure or a structure having a patterned thin film.

It should be noted that, in the embodiment shown in FIGS. 9, 11 to 13, one inorganic functional layer 12 is exemplarily shown. It should be understood by one of ordinary skill in the art that, in the embodiment of the present disclosure, the number of the inorganic functional layers 12 disposed in the flat light-shielding functional layer 6 may be one, two or more; in addition, in a case where the number of the inorganic functional layers 12 is two or more, positions where the inorganic functional layers 12 are located are not limited. In practical applications, the number, the function and the material of the inorganic functional layers 12 in the flat light-shielding functional layer 6 may be set in advance as desired.

Figure 14:
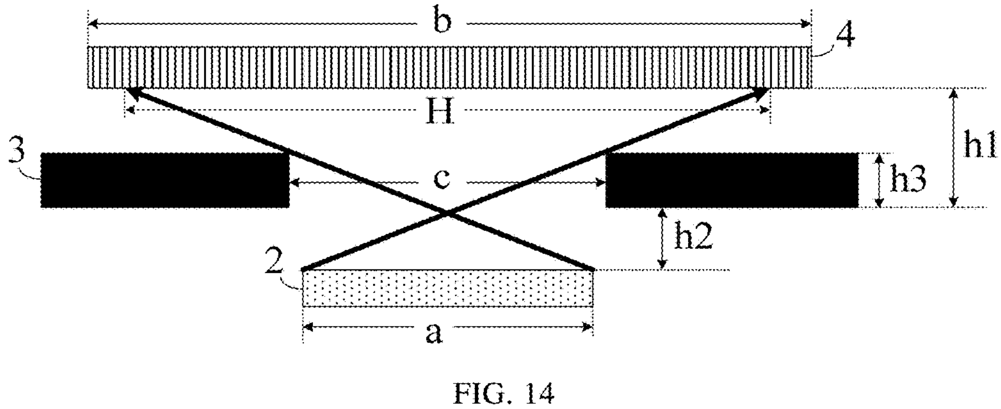
FIG. 14 is a schematic diagram of a structure of a light-emitting unit, and a light outgoing opening and a color filter pattern corresponding to the light-emitting unit according to an embodiment of the present disclosure.

FIG. 14 is a schematic diagram of a structure of a light-emitting unit and a light outgoing opening and a color filter pattern corresponding to the light-emitting unit according to an embodiment of the present disclosure. As shown in FIG. 14, for any one color filter pattern 4, a width of the light outgoing opening corresponding to the color filter pattern 4 in a preset direction is c, a width of the color filter pattern 4 in the preset direction is a, a width of the light-emitting unit 2 corresponding to the color filter pattern 4 in the preset direction is c, a distance between a plane where a surface of the color filter pattern 4 close to the base 1 is located and a plane where a surface of the black matrix 3 close to the base 1 is located is h1, a distance between a plane where a surface of the light-emitting unit 2 corresponding to the color filter pattern 4 away from the base 1 is located and a plane where the surface of the black matrix 3 close to the base 1 is located is h2, and a thickness of the black matrix 3 in a direction perpendicular to the base 1 is h3. It should be noted that the "preset direction" is any direction parallel to a plane where the base 1 is located.

In the present disclosure, after the light emitted by the light-emitting unit 2 is irradiated to a surface of the corresponding color filter pattern 4 close to the base 1 through the corresponding light outgoing opening, a width of a corresponding irradiated area in the preset direction is H; by a proportional calculation, the following can be derived:

$$H=[h1+h2)/(h2+h3)]*a+[h1+2*h2+h3)/(h2+h3)]*c.$$

In order to ensure the light-shielding effect of each color filter pattern 4, the width b of the color filter pattern 4 in the preset direction necessarily satisfies b≥H, i.e., b≥[h1+h2)/(h2+h3)]*a+[(h1+2*h2+h3)/(h2+h3)]*c.

Figure 15:
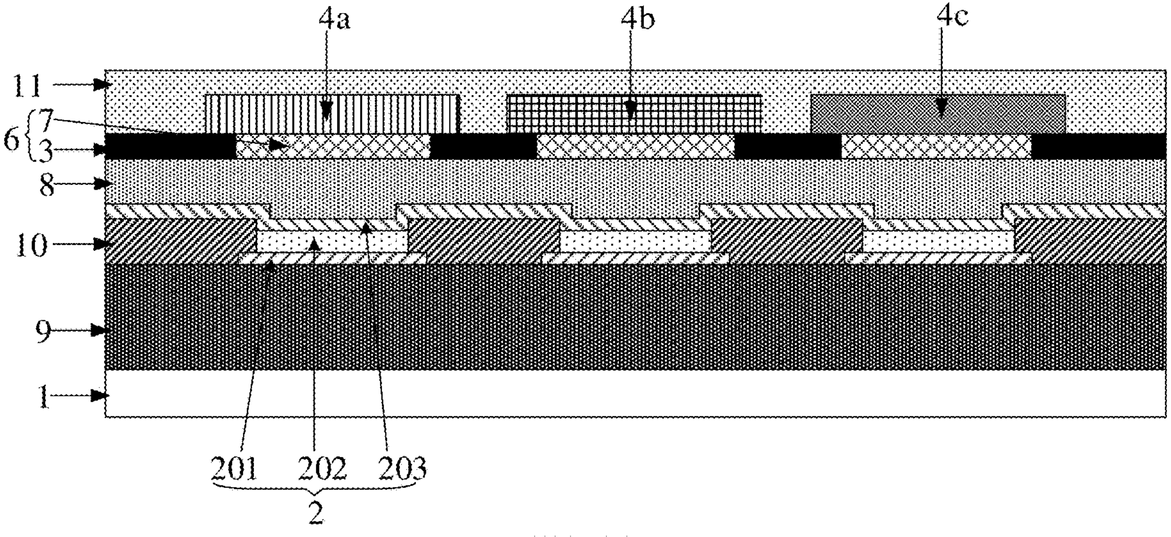
FIG. 15 is a schematic cross-sectional view of a display substrate according to an embodiment of the present disclosure.
Figure 16:
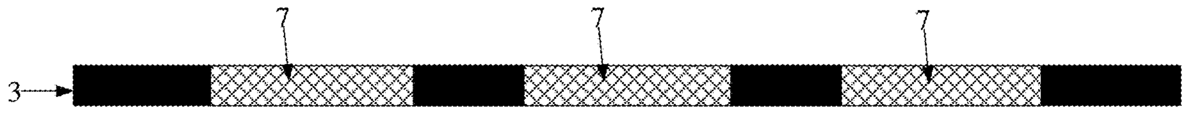
FIG. 16 is a schematic cross-sectional view of a flat light-shielding functional layer shown in FIG. 15.

FIG. 15 is a schematic cross-sectional view of a display substrate according to an embodiment of the present disclosure; FIG. 16 is a schematic cross-sectional view of a flat light-shielding functional layer shown in FIG. 15. As shown in FIG. 15 and FIG. 16, unlike the above embodiments, the first planarization layer 7 shown in FIG. 15 and FIG. 16 is located in the light outgoing openings, and a surface of the first planarization layer 7 away from the base 1 is flush with a surface of the black matrix 3 away from the base 1. In this case, the surface of the first planarization layer 7 away from the base 1 and the surface of the black matrix 3 away from the substrate together constitute a surface of the flat light-shielding functional layer 6 away from the base 1.

It should be noted that the flat light-shielding functional layer 6 in the embodiment of the present disclosure may also adopt other structures different from those in the embodiments shown in FIG. 9, FIG. 11, FIG. 12, FIG. 13, and FIG. 16. Other solutions are not described here one by one. In the embodiment of the present disclosure, it is only necessary to ensure that the flat light-shielding functional layer 6 at least includes the black matrix 3 and the first planarization layer 7, and the surface of the flat light-shielding functional layer 6 away from the base 1 is substantially flat.

In some implementations, the plurality of color filter patterns includes: a first color filter pattern **4*a*, a second color filter pattern 4*b*, and a third color filter pattern 4*c*; for a surface of the first color filter pattern 4*a* close to the base 1, a surface of the second color filter pattern 4*b* close to the base 1 and a surface of the third color filter pattern 4*c* close to the base 1, all of the three are substantially located on a same plane, i.e., as illustrated in the embodiments shown in FIGS. 5, 10 and 15. It should be noted that the "all of the three are substantially located on a same plane" specifically means that the surface of the first color filter pattern 4*a* close to the base 1, the surface of the second color filter pattern 4*b* close to the base 1 and the surface of the third color filter pattern 4*c* close to the base 1** are located on the same plane or approximately on the same plane.

Figure 17:
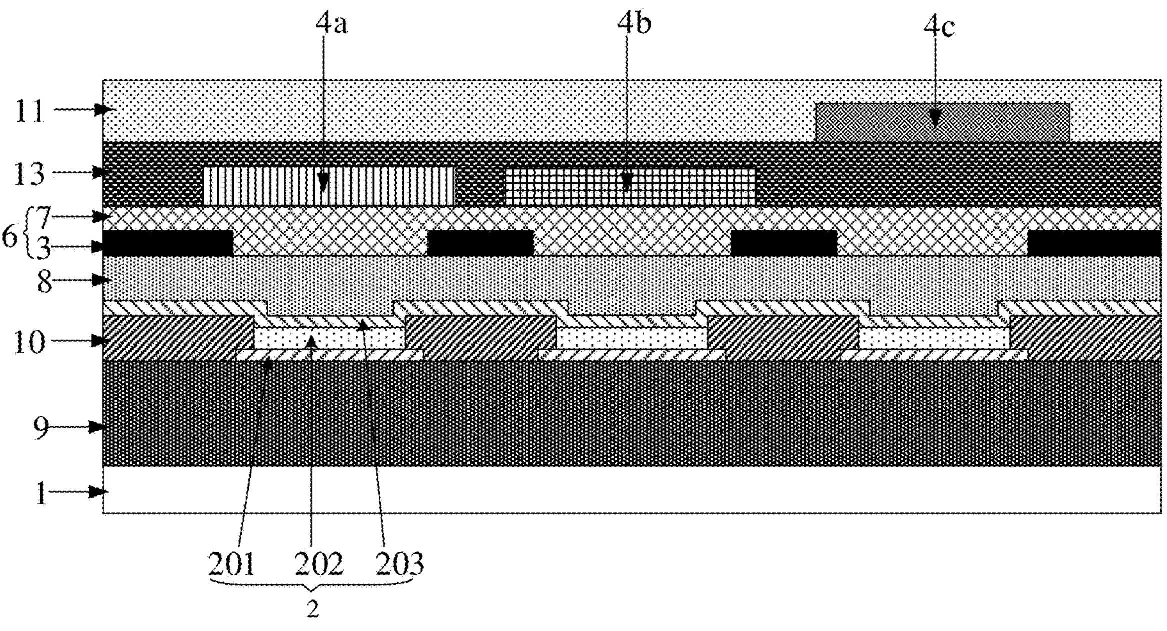
FIG. 17 is a schematic cross-sectional view of a display substrate according to an embodiment of the present disclosure.

FIG. 17 is a schematic cross-sectional view of a display substrate according to an embodiment of the present disclosure. As shown in FIG. 17, unlike the above embodiments, in the display substrate shown in FIG. 17, the surface of the first color filter pattern **4*a* close to the base 1 and the surface of the second color filter pattern 4*b* close to the base 1 are located on the same plane; the surface of the third color filter pattern 4*c* close to the base 1 and the surface of the first color filter pattern 4*a* close to the base 1 are located on different planes, and a second planarization layer 13 is disposed between a plane where the surface of the first color filter pattern 4*a* close to the base 1 is located and a plane where the surface of the third color filter pattern 4*c* close to the base 1 is located. That is, the first color filter pattern 4***a* and the second color filter pattern 4*b* are disposed in the same layer, and the third color filter pattern 4*c* and the first color filter pattern 4*a*/the second color filter pattern 4*b* are disposed in different layers.

Figure 18:
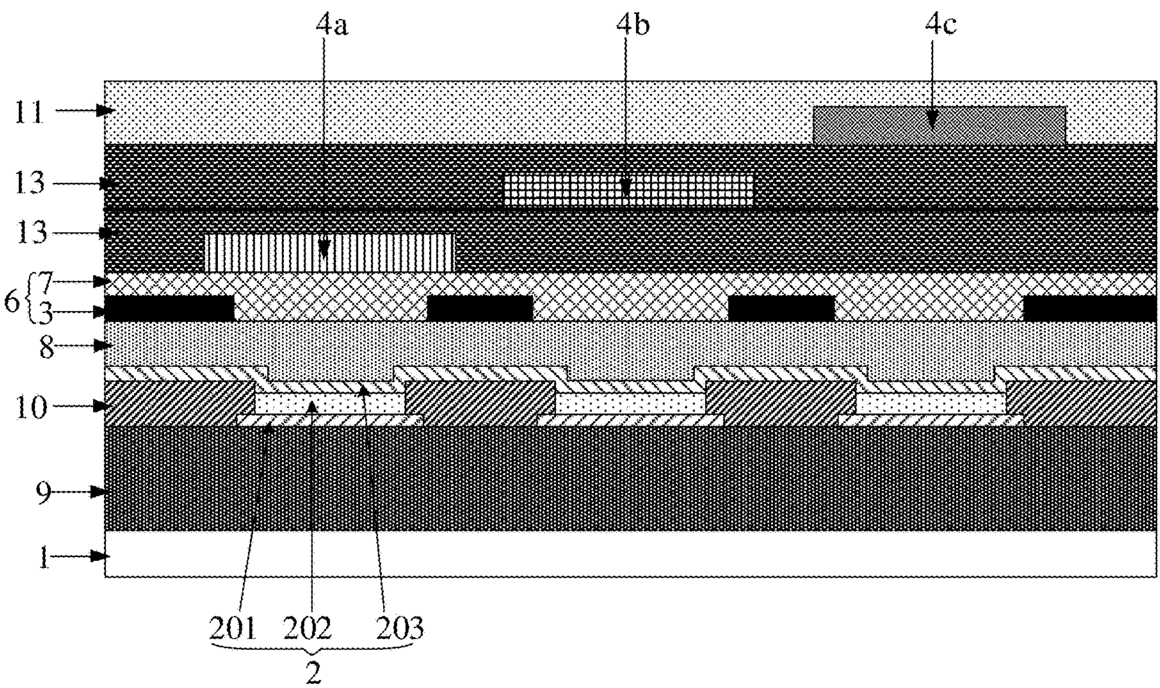
FIG. 18 is a schematic cross-sectional view of a display substrate according to an embodiment of the present disclosure.

FIG. 18 is a schematic cross-sectional view of a display substrate according to an embodiment of the present disclosure. As shown in FIG. 18, unlike the above embodiments, in the display substrate shown in FIG. 18, for the surface of the first color filter pattern 4*a* close to the base 1, the surface of the second color filter pattern 4*b* close to the base 1, and the surface of the third color filter pattern 4*c* close to the base 1, any two of the three are located on different planes, and a second planarization layer 13 is disposed between every two of the three. That is, any two of the first color filter pattern 4*a*, the second color filter pattern 4*b*, and the third color filter pattern 4*c* are provided in different layers.

In the embodiments shown in FIGS. 17 and 18, the color filter patterns are located on different planes, so that the display apparatus can simultaneously present display pictures with different depths of field, that is, naked-eye 3D display can be realized.

In some implementations, for the first color filter pattern 4*a*, the second color filter pattern 4*b*, and the third color filter pattern 4*c*, a first one is a red filter pattern, a second one is a green filter pattern, and a third one is a blue filter pattern.

In some implementations, a material of the color filter patterns includes amorphous silicon, which has a permeability for light in a red wavelength band, that is, the light in the red wavelength band can pass through the amorphous silicon, and light in blue and green wavelength bands is absorbed by the amorphous silicon, which is similar to the function of a conventional organic red filter. The amorphous silicon is used to form the red filter patterns, so that the surface of each red filter pattern away from the base 1 can have the better flatness than that of the conventional organic red filter.

In some implementations, the green filter pattern and the blue filter pattern are made of organic materials.

In some implementations, an encapsulation layer 8 is provided between the light-emitting units 2 and the flat light-shielding functional layer 6. Generally, the encapsulation layer 8 includes inorganic encapsulation sub-layers and organic encapsulation sub-layers, which are alternately disposed; such as a three-layer stacked structure consisting of an inorganic encapsulation sub-layer, an organic encapsulation sub-layer and an inorganic encapsulation sub-layer. The technical solution of the present disclosure does not limit the specific structure of the encapsulation layer 8.

Figure 19:
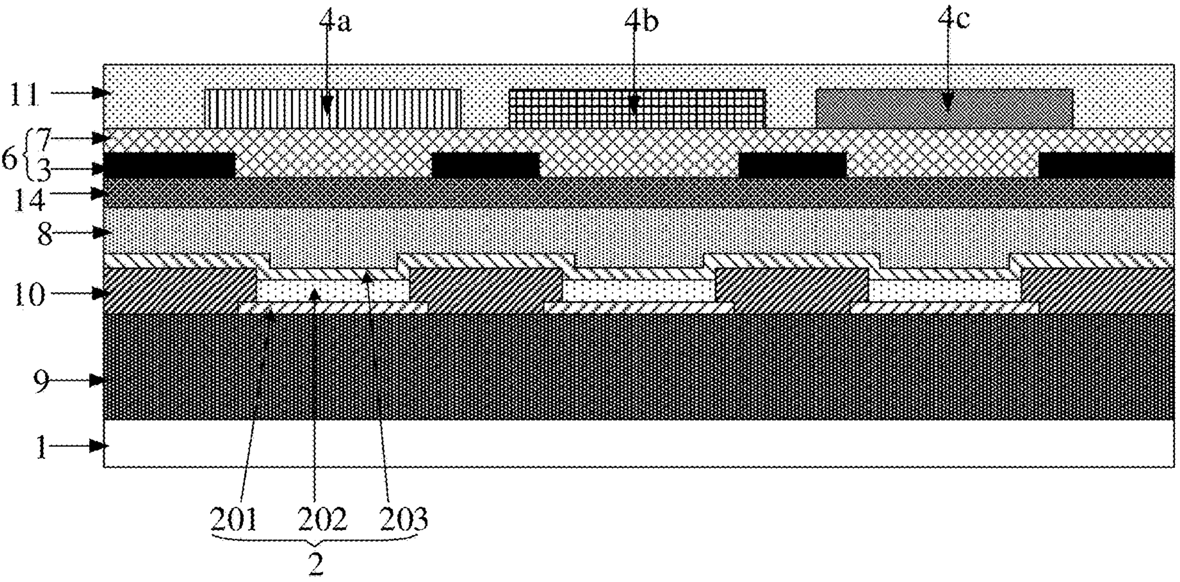
FIG. 19 is a schematic cross-sectional view of a display substrate according to an embodiment of the present disclosure.

FIG. 19 is a schematic cross-sectional view of a display substrate according to an embodiment of the present disclosure. As shown in FIG. 19, in some implementations, in addition to the encapsulation layer 8 in the display substrate, a touch functional layer 14 is disposed between the encapsulation layer 8 and the flat light-shielding functional layer 6. The touch functional layer 14 is provided with touch electrodes for touch detection. In some implementations, the touch electrodes may be self-capacitive or mutual capacitive touch electrodes, and the mutual capacitive touch electrodes include touch scanning electrodes and touch sensing electrodes.

Figure 20:
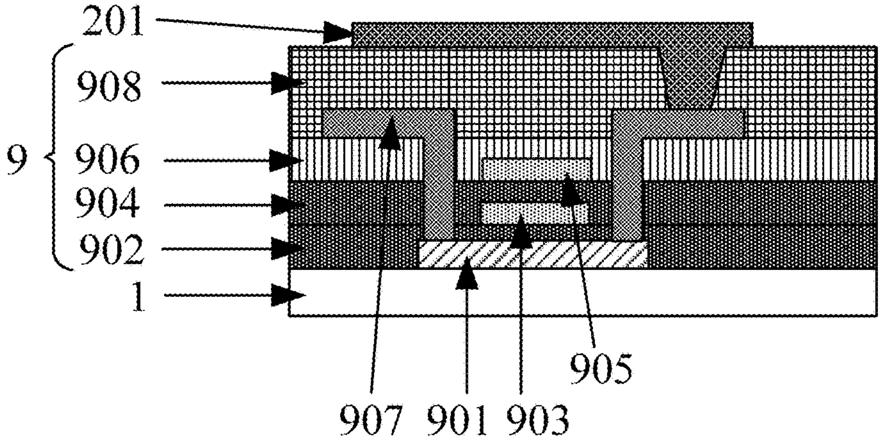
FIG. 20 is a schematic cross-sectional view of a driving functional layer according to an embodiment of the present disclosure.

FIG. 20 is a schematic cross-sectional view of a driving functional layer according to an embodiment of the present disclosure. As shown in FIG. 20, in the embodiment of the present disclosure, a driving functional layer 9 is further disposed between the base 1 and the light-emitting units 2; and a driving circuit for driving the light-emitting units 2 is formed in the driving functional layer 9, and includes transistors (e.g., driving transistors) and capacitors.

In some implementations, the driving functional layer includes an active layer 901, a first gate insulating layer 902, a first gate metal layer 903, a second gate insulating layer 904, a second gate metal layer 905, an interlayer dielectric layer 906, a source-drain metal layer 907, and a third planarization layer 908 which are sequentially arranged in a direction away from the base 1. The active layer 901 includes an active pattern of the transistors, the first gate metal layer 903 includes a gate pattern of the transistors, the second gate metal layer 905 includes at least electrodes, for the capacitors, (the first gate metal layer and the second gate metal layer may further include other conductive structures, such as signal traces and various electrodes and the like), which may form storage capacitors together with gate electrodes of the transistors, the source-drain metal layer 907 includes a source pattern and a drain pattern of the transistors, and an anode 201 of each light-emitting unit 2 is connected to a drain electrode of a corresponding transistor (e.g., a corresponding driving transistor) through a via in the third planarization layer 908.

In some implementations, a protection layer 11 is disposed on a side of the color filter layer away from the base 1, and may be made of polyimide or glass or the like.

In some implementations, a pixel defining layer 10 is further disposed in the display substrate, is provided therein with a plurality of pixel accommodating holes in one-to-one correspondence with the light-emitting units 2, and the light-emitting units 2 are located in the corresponding pixel accommodating holes.

FIG. 21 is a flowchart of a method for manufacturing a display substrate according to an embodiment of the present disclosure. As shown in FIG. 21, the method may be applied for manufacturing the display substrate according to any of the above embodiments and includes following steps S1 to S3.

Step S1, forming a plurality of light-emitting units on a side of a base.

Step S2, forming a flat light-shielding functional layer on a side of the light-emitting units away from the base, the flat light-shielding functional layer including a black matrix and a first planarization layer, the black matrix being provided therein with a plurality of light outgoing openings in one-to-one correspondence with the light-emitting units, and the first planarization layer at least filling the light outgoing openings.

Step S3, forming a color filter layer on a side of the flat light-shielding functional layer away from the base, the color filter layer including a plurality of color filter patterns in one-to-one correspondence with the light outgoing openings; an orthographic projection of each color filter pattern on the base completely covering an orthographic projection of the light outgoing opening corresponding to the color filter pattern on the base.

For the detailed description of the steps S1 to S3, reference may be made to the corresponding contents in the above embodiments, which are not repeated herein.

In some implementations, the method may further include a step of forming a driving functional layer before step S1, a step of forming an encapsulation layer and a touch functional layer between step S1 and step S2, and a step of forming a protection layer after step S3. For details, reference may be made to the above corresponding content in the above embodiments.

Based on the same inventive concept, an embodiment of the present disclosure further provides a display panel, including the display substrate provided in any of the above embodiments.

Based on the same inventive concept, an embodiment of the present disclosure further provides a display apparatus, which includes the display panel provided in any of the above embodiments.

The display apparatus provided by the embodiment of the present disclosure may be any product or component with a display function, such as a mobile phone, a tablet computer, a television, a display, a notebook computer, a digital photo frame, a navigator and the like.

It should be understood that the above embodiments are merely exemplary embodiments adopted to explain the principles of the present disclosure, and the present disclosure is not limited thereto. It will be apparent to one of ordinary skill in the art that various changes and modifications may be made without departing from the spirit and scope of the present disclosure, and such changes and modifications also fall within the scope of the present disclosure.

What is claimed is:

1. A display substrate, comprising:

a base;

a plurality of light-emitting units on a side of the base;

a flat light-shielding functional layer, comprising a black matrix and a first planarization layer, on a side of the plurality of light-emitting units away from the base, a plurality of light outgoing openings being provided in the black matrix and being in one-to-one correspondence with the plurality of light-emitting units, and the first planarization layer at least filling the plurality of light outgoing openings; and a color filter layer, comprising a plurality of color filter patterns in one-to-one correspondence with the plurality of light outgoing openings, on a side of the flat light-shielding functional layer away from the base, an orthographic projection of each of the plurality of color filter patterns on the base covering an orthographic projection of the light outgoing opening corresponding to the color filter pattern on the base, wherein a transmittance p of the first planarization layer for visible light satisfies: $p \geq 50\%$.

2. The display substrate according to claim 1, wherein a minimum thickness of the flat light-shielding functional layer in a direction perpendicular to the base is $H\_min$, a maximum thickness of the flat light-shielding functional layer in the direction perpendicular to the base is $H\_max$, and $H\_min/H\_max \geq 0.95$.

3. The display substrate according to claim 1, wherein a surface of the flat light-shielding functional layer away from the base is substantially flat.

4. The display substrate of claim 1, wherein the first planarization layer is in the plurality of light outgoing openings, and a surface of the first planarization layer away from the base is substantially flush with a surface of the black matrix away from the base.

5. The display substrate according to claim 1, wherein the first planarization layer comprises first portions in the plurality of light outgoing openings and a second portion on a side of the black matrix away from the base, the second portion completely covers the first portions and the black matrix, and a surface of the second portion away from the base is substantially flat.

6. The display substrate according to claim 5, wherein for any one color filter pattern, a width b of the color filter pattern in a preset direction parallel to the base satisfies:

$$b \geq [(h1+h2)/(h2+h3)]*a+[(h1+2*h2+h3)/(h2+h3)]*c,$$

where c is a width of the light outgoing opening corresponding to the color filter pattern in the preset direction; a is a width of the light-emitting unit corresponding to the color filter pattern in the preset direction, h1 is a distance between a plane where a surface of the color filter pattern close to the base is located and a plane where a surface of the black matrix close to the base is located, h2 is a distance between a plane where a surface of the light-emitting unit corresponding to the color filter pattern away from the base is located and a plane where the surface of the black matrix close to the base is located, and h3 is a thickness of the black matrix in a direction perpendicular to the base.

7. The display substrate according to claim 5, wherein the flat light-shielding functional layer further comprises at least one inorganic functional layer made of an inorganic material; and for any one inorganic functional layer, the inorganic functional layer is on a side of the first planarization layer away from the black matrix or on a side of the first planarization layer close to the black matrix.

8. The display substrate according to claim 7, wherein the at least one inorganic functional layer comprises a quarter-wave plate.

9. The display substrate according to claim 1, wherein the first planarization layer is made of an organic insulating material.

10. The display substrate according to claim 1, wherein the plurality of color filter patterns comprises a first color filter pattern, a second color filter pattern, and a third color filter pattern; and a surface of the first color filter pattern close to the base, a surface of the second color filter pattern close to the base and a surface of the third color filter pattern close to the base are substantially on a same plane;

or, the surface of the first color filter pattern close to the base and the surface of the second color filter pattern close to the base are on the same plane; the surface of the third color filter pattern close to the base and the surface of the first color filter pattern close to the base are on different planes, and the display substrate further comprises a second planarization layer between a plane where the surface of the first color filter pattern close to the base is located and a plane where the surface of the third color filter pattern close to the base is located;

or, any two of the surface of the first color filter pattern close to the base, the surface of the second color filter pattern close to the base, and the surface of the third color filter pattern close to the base are on different planes, and the display substrate further comprises a second planarization layer between every two of the surface of the first color filter pattern close to the base, the surface of the second color filter pattern close to the base, and the surface of the third color filter pattern close to the base.

11. The display substrate according to claim 10, wherein for the first color filter pattern, the second color filter pattern, and the third color filter pattern, a first one is a red filter pattern, a second one is a green filter pattern, and a third one is a blue filter pattern.

12. The display substrate according to claim 10, wherein the plurality of color filter patterns are made of amorphous silicon.

13. The display substrate according to claim 1, further comprising an encapsulation layer between the plurality of light-emitting units and the flat light-shielding functional layer.

14. The display substrate according to claim 13, further comprising a touch functional layer between the encapsulation layer and the flat light-shielding functional layer.

15. A display panel, comprising: the display substrate according to claim 1.

16. A display apparatus, comprising: the display panel according to claim 15.

17. A method for manufacturing the display substrate according to claim 1, the method comprises:

forming a plurality of light-emitting units on a side of a base;

forming a flat light-shielding functional layer on a side of the plurality of light-emitting units away from the base, the flat light-shielding functional layer comprising a black matrix and a first planarization layer, the black matrix being provided therein with a plurality of light outgoing openings in one-to-one correspondence with the plurality of light-emitting units, and the first planarization layer at least filling the plurality of light outgoing openings; and forming a color filter layer on a side of the flat light-shielding functional layer away from the base, the color filter layer comprising a plurality of color filter patterns in one-to-one correspondence with the plurality of light outgoing openings, an orthographic projection of each color filter pattern on the base completely covering an orthographic projection of the light outgoing opening corresponding to the color filter pattern on the base.

18. A display substrate, comprising:

a base;

a plurality of light-emitting units on a side of the base;

a flat light-shielding functional layer, comprising a black matrix and a first planarization layer, on a side of the plurality of light-emitting units away from the base, a plurality of light outgoing openings being provided in the black matrix and being in one-to-one correspondence with the plurality of light-emitting units, and the first planarization layer at least filling the plurality of light outgoing openings; and a color filter layer, comprising a plurality of color filter patterns in one-to-one correspondence with the plurality of light outgoing openings, on a side of the flat light-shielding functional layer away from the base, an orthographic projection of each of the plurality of color filter patterns on the base covering an orthographic projection of the light outgoing opening corresponding to the color filter pattern on the base, wherein the first planarization layer comprises first portions in the plurality of light outgoing openings and a second portion on a side of the black matrix away from the base, the second portion completely covers the first portions and the black matrix, and a surface of the second portion away from the base is substantially flat, wherein for any one color filter pattern, a width b of the color filter pattern in a preset direction parallel to the base satisfies:

$$b \geq [(h1+h2)/(h2+h3)]*a+[(h1+2*h2+h3)/(h2+h3)]*c,$$

where c is a width of the light outgoing opening corresponding to the color filter pattern in the preset direction; a is a width of the light-emitting unit corresponding to the color filter pattern in the preset direction, h1 is a distance between a plane where a surface of the color filter pattern close to the base is located and a plane where a surface of the black matrix close to the base is located, h2 is a distance between a plane where a surface of the light-emitting unit corresponding to the color filter pattern away from the base is located and a plane where the surface of the black matrix close to the base is located, and h3 is a thickness of the black matrix in a direction perpendicular to the base.

19. A display substrate, comprising:

a base;

a plurality of light-emitting units on a side of the base;

a flat light-shielding functional layer, comprising a black matrix and a first planarization layer, on a side of the plurality of light-emitting units away from the base, a plurality of light outgoing openings being provided in the black matrix and being in one-to-one correspondence with the plurality of light-emitting units, and the first planarization layer at least filling the plurality of light outgoing openings; and a color filter layer, comprising a plurality of color filter patterns in one-to-one correspondence with the plurality of light outgoing openings, on a side of the flat light-shielding functional layer away from the base, an orthographic projection of each of the plurality of color filter patterns on the base covering an orthographic projection of the light outgoing opening corresponding to the color filter pattern on the base, wherein the plurality of color filter patterns comprises a first color filter pattern, a second color filter pattern, and a third color filter pattern; and the surface of the first color filter pattern close to the base and the surface of the second color filter pattern close to the base are on the same plane; the surface of the third color filter pattern close to the base and the surface of the first color filter pattern close to the base are on different planes, and the display substrate further comprises a second planarization layer between a plane where the surface of the first color filter pattern close to the base is located and a plane where the surface of the third color filter pattern close to the base is located;

or, any two of the surface of the first color filter pattern close to the base, the surface of the second color filter pattern close to the base, and the surface of the third color filter pattern close to the base are on different planes, and the display substrate further comprises a second planarization layer between every two of the surface of the first color filter pattern close to the base, the surface of the second color filter pattern close to the base, and the surface of the third color filter pattern close to the base.

* * * * *